(12) United States Patent
Chu

(10) Patent No.: US 10,653,017 B2
(45) Date of Patent: May 12, 2020

(54) GLASS LAYER FOR DISPLAY SCREEN AND DISPLAY SCREEN

(71) Applicant: BOE TECHNOLOGY GROUP CO., LTD., Beijing (CN)

(72) Inventor: Xiao Chu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/991,162

(22) Filed: May 29, 2018

(65) Prior Publication Data

US 2019/0098773 A1  Mar. 28, 2019

(30) Foreign Application Priority Data

Sep. 28, 2017  (CN) .......................... 2017 1 0900493

(51) Int. Cl.
| | |
|---|---|
| *H05K 5/00* | (2006.01) |
| *H05K 5/03* | (2006.01) |
| *H05K 5/06* | (2006.01) |
| *G02F 1/13* | (2006.01) |
| *G02F 1/1335* | (2006.01) |
| *G02F 1/1333* | (2006.01) |

(52) U.S. Cl.
CPC ............. *H05K 5/0017* (2013.01); *G02F 1/13* (2013.01); *G02F 1/1313* (2013.01); *H05K 5/03* (2013.01); *H05K 5/06* (2013.01); *G02F 1/133526* (2013.01); *G02F 2001/133331* (2013.01)

(58) Field of Classification Search
None
See application file for complete search history.

(56) References Cited

U.S. PATENT DOCUMENTS

| | | | | |
|---|---|---|---|---|
| 9,374,922 | B1* | 6/2016 | Lin | .................... G02F 1/133308 |
| 2007/0243634 | A1* | 10/2007 | Pamula | ............... B01F 13/0071 |
| | | | | 436/518 |
| 2018/0095309 | A1* | 4/2018 | Yu | .......................... G02F 1/1339 |

(Continued)

FOREIGN PATENT DOCUMENTS

| | | |
|---|---|---|
| CN | 1824622 A | 8/2006 |
| CN | 101168475 A | 4/2008 |

(Continued)

OTHER PUBLICATIONS

First Office Action for Chinese Patent Application No. 201710900493.8 dated Mar. 15, 2019.

(Continued)

*Primary Examiner* — Courtney L Smith
*Assistant Examiner* — Rashen E Morrison
(74) *Attorney, Agent, or Firm* — Calfee, Halter & Griswold LLP

(57) ABSTRACT

The present disclosure provides a glass layer for a display screen and a display screen, including: a glass layer body having a transverse direction and a longitudinal direction perpendicular to each other; a plurality of ribs spaced apart from each other and arranged on an upper surface of the glass layer body, a groove being formed between every two adjacent said ribs; a movable brush arranged on an outer surface of each of said ribs; a drive connection mechanism connecting with the movable brush for driving the movable brush to be reciprocated on the outer surface of said ribs.

16 Claims, 4 Drawing Sheets

(56) References Cited

U.S. PATENT DOCUMENTS

2018/0188230 A1* 7/2018 Huff ................. G01N 33/48721
2018/0275088 A1* 9/2018 Huff ....................... C12Q 1/004

FOREIGN PATENT DOCUMENTS

| CN | 202049682 U | 11/2011 |
| CN | 103180060 A | 6/2013 |
| CN | 204480610 U | 7/2015 |
| CN | 105530416 A | 4/2016 |
| CN | 205594997 U | 9/2016 |
| CN | 206340297 U | 7/2017 |
| CN | 206471078 U | 9/2017 |
| CN | 206991736 U | 2/2018 |

OTHER PUBLICATIONS

Second Office Action for Chinese Patent Application No. 201710900493.8 dated Aug. 8, 2019.

* cited by examiner

GLASS LAYER FOR DISPLAY SCREEN AND DISPLAY SCREEN

CROSS REFERENCE

This application is based upon and claims priority to Chinese Patent Application No. 201710900493.8, filed on Sep. 28, 2017, the entire contents thereof are incorporated herein by reference.

TECHNICAL FIELD

The present disclosure relates to the field of a display screen, in particular to a glass layer for a display screen and a display screen.

BACKGROUND

With the rapid development of the information age, more and more users will choose to install a display in their bathroom. However, as the display screen in the prior art is generally a planar structure, water vapor may contact with the display screen as the water vapor is heavy in the bathroom when the user is watching the display screen in the bathroom, so that a large number of water droplets are formed on the display screen, thereby causing display of the display screen unclear which is adverse to visual effect viewed by the user, and thus reducing user experiences.

SUMMARY

In one aspect of the present disclosure, an embodiment of the present disclosure provides a glass layer for a display screen, including: a glass layer body having a transverse direction and a longitudinal direction perpendicular to each other;
a plurality of ribs spaced apart from each other and arranged on an upper surface of the glass layer body, a groove being formed between every two adjacent ribs;
a movable brush arranged on an outer surface of each of said ribs;
a drive mechanism connecting with the movable brush for driving the movable brush to be reciprocated on the outer surface of said ribs.

In an implementation of the present disclosure, the plurality of ribs are arranged in parallel along the transverse direction of the glass layer body. Each of said ribs extends along the longitudinal direction of the glass layer body from a top end of the glass layer body to a bottom end of the glass layer body.

In an implementation of the present disclosure, a length of the rib is equal to a length of the glass layer body in the longitudinal direction.

In an implementation of the present disclosure, the outer surface of the rib is a cylindrical surface.

In an implementation of the present disclosure, a cross-section shape of the rib is rectangular.

In an implementation of the present disclosure, the movable brush has a surface attached to the outer surface of the rib.

In an implementation of the present disclosure, a width W1 of each of said grooves is greater than or equal to a width W2 of the movable brush.

In an implementation of the present disclosure, both ends of the groove are drain outlets.

In an implementation of the present disclosure, the movable brush is made of transparent material.

In an implementation of the present disclosure, the movable brush is a polyelectrolyte brush.

A display screen includes a display panel and the glass layer for a display screen as described above arranged on the display panel.

In an implementation of the present disclosure, the display panel is attached to a lower surface of the glass layer.

In an implementation of the present disclosure, the peripheries of the display panel and the glass layer are sealed.

In an implementation of the present disclosure, the plurality of ribs are arranged in parallel along the transverse direction of the glass layer body. Each of said ribs extends along the longitudinal direction of the glass layer body from a top end of the glass layer body to a bottom end of the glass layer body.

In an implementation of the present disclosure, the movable brush has a surface attached to the outer surface of the rib.

In an implementation of the present disclosure, the display screen further includes a haze detecting device respectively electrically connecting the display panel and the drive mechanism, the haze detecting device detecting a number of blurry pixels of the display panel and determining whether to control the drive mechanism to drive the movable brush sliding according to the number of blurry pixels.

Additional features and advantages of the present disclosure will be set forth in the subsequent description and in part will be obvious from the description, or will be learn by implementing the present disclosure. Objectives and other advantages of the present disclosure may be realized and obtained by the structure particularly pointed out in the description, claims and accompanying drawings.

BRIEF DESCRIPTION OF THE DRAWINGS

Accompanying drawings are used to provide a further understanding of technical solutions of the present disclosure and constitute part of the specification, and are used together with embodiments of the present application to explain technical solutions of the present disclosure and do not constitute limitations on the technical solutions of the present disclosure.

DETAILED DESCRIPTION

Figure 1:
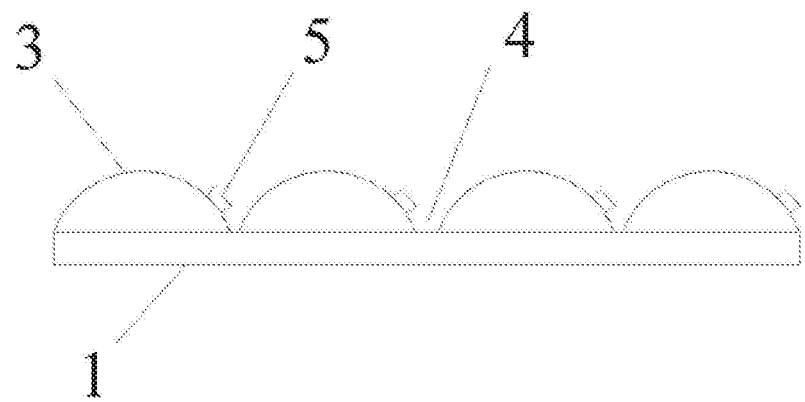
FIG. 1 is a side view of the glass layer for a display screen provided by an embodiment of the present disclosure.

In order to make the objectives, technical solutions and advantages of the present disclosure clearer, embodiments of the present disclosure will be described in detail with reference to accompanying drawings in the following. It should be noted that embodiments of the present application and features in the embodiments may be combined with each other in an arbitrary manner without any conflict.

A glass layer for a display screen includes: a glass layer body 1 having a transverse direction and a longitudinal direction perpendicular to each other; a plurality of ribs 3 spaced apart from each other and arranged on an upper surface of the glass layer body 1, a groove 4 being formed between every two adjacent ribs; a movable brush 5 arranged on an outer surface of each of said ribs 3; a drive mechanism 2 connecting with the movable brush 5 for driving the movable brush 5 to be reciprocated on the outer surface of said ribs 3.

First Embodiment

Figure 2:
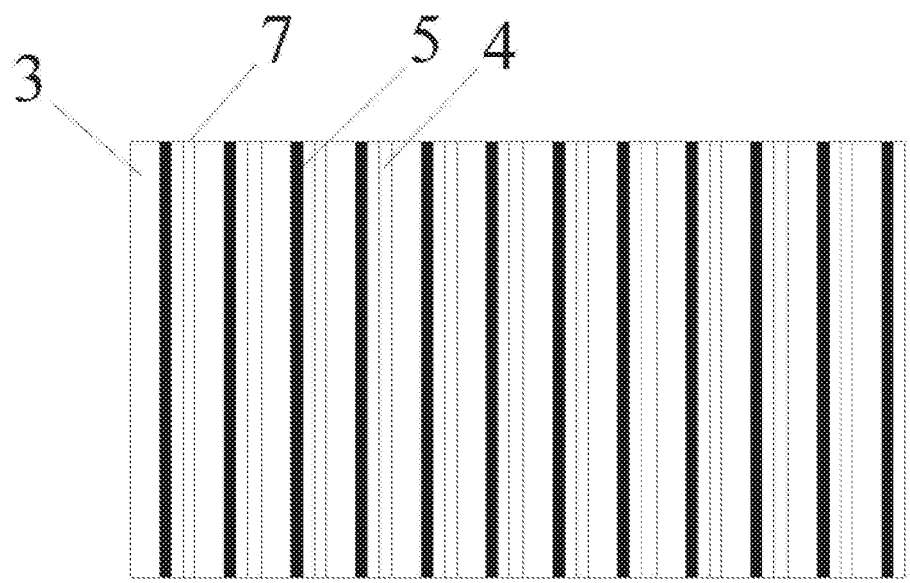
FIG. 2 is a top view of the glass layer for a display screen provided by an embodiment of the present disclosure.
Figure 3:
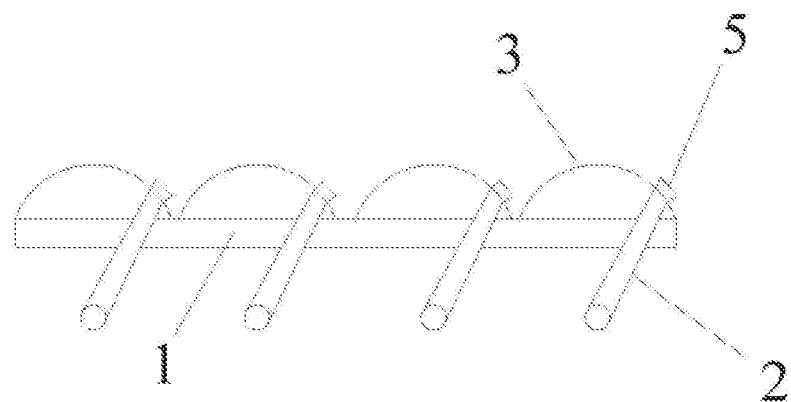
FIG. 3 is a schematic view of driving of the movable brush of the glass layer for a display screen provided by an embodiment of the present disclosure.

As shown in FIGS. 1-3, a glass layer for a display screen includes a glass layer body 1 made of transparent glass for sealing a display panel 6 so that the display panel 6 has a function of waterproof. An outer surface of the glass layer body 1 is provided with a plurality of ribs 3 spaced apart from each other and arranged on an upper surface of the glass layer body 1, in particular strip-shaped projections protruding outwards from the glass layer body 1. The plurality of ribs 3 are arranged in parallel along the transverse direction of the glass layer body 1. Each of said ribs 3 extends along the longitudinal direction of the glass layer body 1 from a top end of the glass layer body 1 to a bottom end of the glass layer body 1. A groove 4 is formed between every two adjacent ribs 3. In this arrangement, water droplets on the glass layer when vertically arranged may slide off from the rib 3 and the groove 4 under the action of gravity. In one embodiment, a length of the rib 3 is equal to a length of the glass layer body 1 in the longitudinal direction. Both ends of the rib 3 are aligned with both sides of the glass layer body 1. Among others, the transverse direction of the glass layer body 1 is a left-right direction of the glass layer body 1 shown in FIG. 2, the longitudinal direction is an up-down direction of the glass layer body 1 shown in FIG. 2, the top end of the glass layer body 1 is an upper side of the glass layer body 1 shown in FIG. 2, and the bottom end is a lower side of the glass layer body 1 shown in FIG. 2. The glass layer body 1 may be sheet-shaped or plate-shaped.

The groove 4 and the rib 3 are arranged in parallel, and both ends of the groove 4 are drain outlets. In one embodiment, drain outlets and both ends of the glass layer body 1 in the longitudinal are aligned.

The outer surface of each of ribs 3 is provided with a movable brush 5. The movable brush 5 is an elongated strip and is arranged in parallel with the rib 3. The movable brush 5 has a surface attaching to the outer surface of the rib 3 and a length which is equal to the length of the rib 3, so that the movable brush 5 may be reciprocated on the outer surface of the rib 3 to remove water droplets on the rib 3. A sliding path of the movable brush 5 communicates with the groove 4. On the one hand, moisture carried by the movable brush 5 may rapidly flow into the groove 4 from top to bottom so as to have a function of receiving water droplets; and on the other hand, a width W1 of the groove 4 is greater than or equal to a width W2 of the movable brush 5, so that the movable brush 5 may be received by the groove 4 to enable the movable brush 5 go into the groove during the sliding process and to improve efficiency of the flow of water droplets into the groove 4. Meanwhile, the movable brush 5 may be disposed within the groove 4 when it is stationary. The movable brush 5 is made of transparent material. In one implementation, the movable brush 5 is a polyelectrolyte brush, which is a charged polymer and has strong hydrophilicity. A contact angle of the movable brush 5 is close to zero and has an excellent effect of water removal.

As shown in FIGS. 1-2, the outer surface of the rib 3 is a cylindrical surface. Cylindrical surfaces of adjacent ribs 3 and the surface of the glass layer body 1 enclose the groove 4. The movable brush 5 has the surface attaching to the outer surface of the rib 3 to facilitate the movable brush 5 to be reciprocated on the outer surface of the rib 3, so that water droplets carried by the movable brush 5 may rapidly flow from top to bottom and moisture may be more effectively removed by the movable brush 5 by means of the cylindrical surface of the rib 3.

As shown in FIG. 3, the glass layer for a display screen in the embodiment further includes a drive mechanism 2. The drive mechanism 2 includes a motor, a drive spindle and a drive rob connecting with the motor. The motor and the drive spindle are located at a side of the glass layer away from the glass layer body 1, for example, they may be located on the back of the display screen after attaching to the display screen. One end of the drive rob is connected with the movable brush 5, and the other end thereof is fixed to the drive spindle. In this embodiment, the movable brush 5 on each rib 3 is connected with a corresponding drive spindle by means of the drive rob. When the drive spindle is rotated by the motor, the drive spindle drives the drive rob to be swung and simultaneously drives the movable brush 5 to be swung, so that the movable brush 5 is to be reciprocated on the outer surface of the glass layer body 1. Thus, water droplets on the rib 3 may be carried by the movable brush 5 to flow into the groove 4 and then be discharged through the drain outlet 7 of the groove 4.

In the embodiment, the movable brush 5 may remove water droplets on the glass layer for a display screen, so that the glass layer for a display screen is free from water vapor in the environment of heavy water vapor such as bathroom and may be normally viewed.

Second Embodiment

Figure 4:
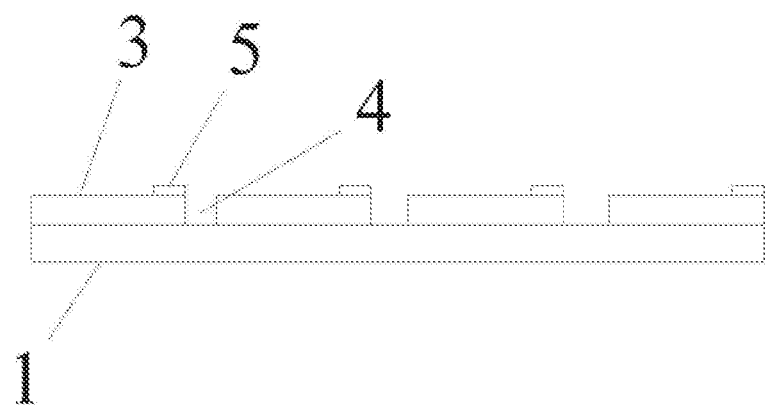
FIG. 4 is another side view of the glass layer for a display screen provided by an embodiment of the present disclosure.
Figure 5:
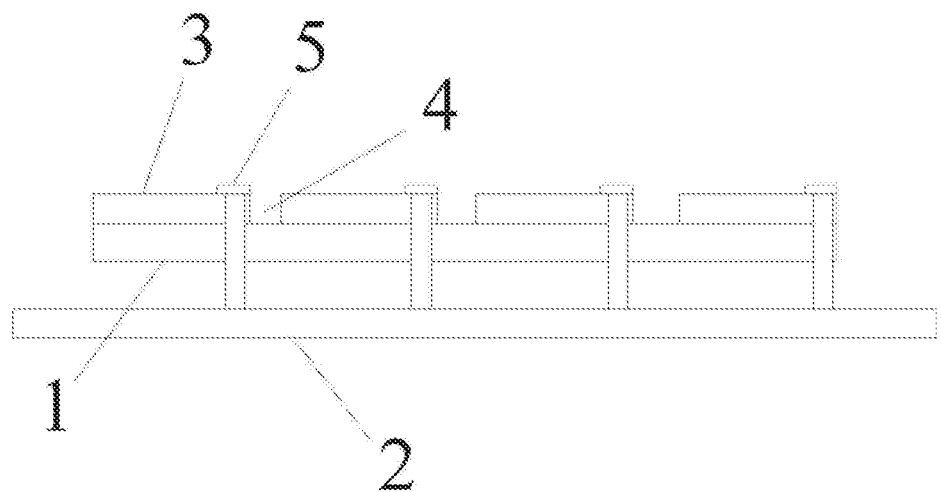
FIG. 5 is another schematic view of driving of the movable brush of the glass layer for a display screen provided by an embodiment of the present disclosure.

The difference between the second embodiment and the first embodiment is that, as shown in FIGS. 4-5, the rib 3 is an elongated rectangular parallelepiped with a rectangular cross-section. The movable brush 5 still has a surface completely attaching to the rib 3. In this embodiment, the drive mechanism 2 includes a motor, a slide rail and a drive rob slidably connected to the slide rail. The slide rail is arranged in parallel with the transverse direction of the glass layer body 1. One end of the drive rob is connected with the slide rail, and the other end thereof is connected with the movable brush 5. In this embodiment, a method for driving the movable brush 5 is: turning on a motor; driving a drive rob to be reciprocated on a slide rail by the motor, and simultaneously bring the movable brush 5 to be reciprocated on an outer surface of a glass layer body 1 by the drive rob; enabling the movable brush 5 to carry water droplets on a rib 3 to flow into a groove 4, and then discharging water droplets through a drain outlet 7 of the groove 4. In this embodiment, an outer surface of the rib 3 is a horizontal surface, so that the horizontal surface of the rib 3 has better viewing results.

Third Embodiment

Figure 6:
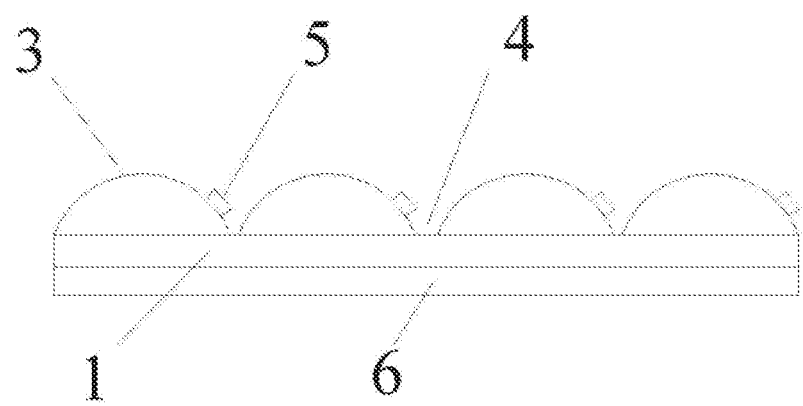
FIG. 6 is a structural schematic view of the display screen provided by an embodiment of the present disclosure.

As shown in FIG. 6, a display screen includes a display panel 6 and the glass layer for a display screen arranged on the surface of the display panel as shown in the first embodiment and the second embodiment. The display panel and a lower surface of the glass layer are attached. The peripheries of the display panel and the glass layer are sealed.

The display screen further includes a haze detecting device respectively electrically connecting the display panel 6 and the drive mechanism 2 in the glass layer for a display screen. The haze detecting device detects a number of blurry pixels of the display panel and determines whether to control the drive mechanism 2 to drive the movable brush 5 sliding according to the number of blurry pixels.

Figure 7:
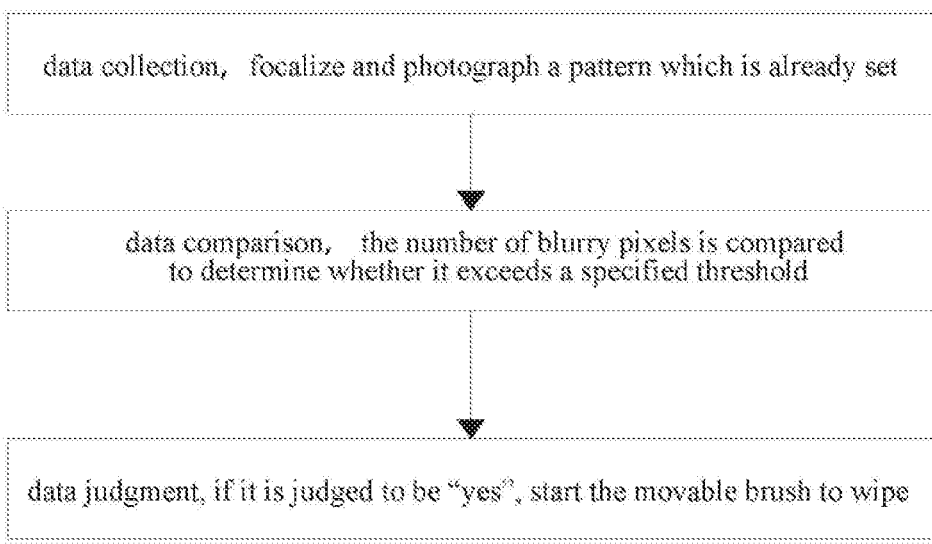
FIG. 7 is a schematic view of a controlling method of the haze detecting device provided by an embodiment of the present disclosure.

As shown in FIG. 7, a controlling method of the haze detecting device in the display screen of this embodiment includes:

data collection, in which the haze detecting device detects a number of blurry pixels of the display panel to focalize and photograph a pattern which is already set;

data comparison, in which a number of blurry pixels due to haze is analyzed and then the data is compared to determine whether it exceeds a specified threshold;

data judgment, in which a judgment module in the haze detecting device is judged to be "yes" if the data exceeds the threshold, therefore the drive mechanism 2 is controlled to drive the movable brush 5 to wipe; and in which the judgment module in the haze detecting device is judged to be "no" if the data does not exceed the threshold, therefore keeping the movable brush 5 stationary.

Although those embodiments of the present disclosure are described in the foregoing, the contents described are merely embodiments applied to facilitate the understanding of the present disclosure, and are not intended to limit the present disclosure. Any modifications and changes may be made on the implementation forms and details by those skilled in the art to which the present disclosure pertains without departing from the spirit and scope disclosed by the present disclosure. However, the patent protection scope of the present disclosure is still subject to the scope defined by the appended claims.

What is claimed is:

1. A glass layer for a display screen, comprising:
   a glass layer body having a transverse direction and a longitudinal direction perpendicular to each other;
   a plurality of ribs spaced apart from each other and arranged on an upper surface of the glass layer body, a length of the rib is equal to a length of the glass layer body in the longitudinal direction, the plurality of ribs are arranged in parallel along the transverse direction of the glass layer body, each of said ribs extends along the longitudinal direction of the glass layer body from a top end of the glass layer body to a bottom end of the glass layer body, a groove being formed between every two adjacent said ribs, wherein both ends of the groove are drain outlets;
   a movable brush arranged on an outer surface of each of said ribs; and
   a drive mechanism connecting with the movable brush for driving the movable brush to be reciprocated on the outer surface of said ribs.

2. The glass layer for a display screen according to claim 1, wherein the outer surface of the rib is a cylindrical surface.

3. The glass layer for a display screen according to claim 1, wherein a cross-section shape of the rib is rectangular.

4. The glass layer for a display screen according to claim 1, wherein the movable brush has a surface attached to the outer surface of the rib.

5. The glass layer for a display screen according to claim 1, wherein a width W1 of each of said grooves is greater than or equal to a width W2 of the movable brush.

6. The glass layer for a display screen according to claim 1, wherein the movable brush is made of transparent material.

7. The glass layer for a display screen according to claim 6, wherein the movable brush is a polyelectrolyte byte.

8. The glass layer for a display screen according to claim 1, wherein the movable brush has a surface attached to the outer surface of the rib.

9. The glass layer for a display screen according to claim 1, wherein a width W1 of each of said grooves is greater than or equal to a width W2 of the movable brush.

10. The glass layer for a display screen according to claim 1, wherein the movable brush is made of transparent material.

11. The glass layer for a display screen according to claim 6, wherein the movable brush is a polyelectrolyte brush.

12. A display screen, wherein the display screen comprises a display panel and a glass layer for the display screen arranged on the display panel, the glass layer for the display screen comprises: a glass layer body having a transverse direction and a longitudinal direction perpendicular to each other; a plurality of ribs spaced apart from each other and arranged on an upper surface of the glass layer body, a length of the rib is equal to a length of the glass layer body in the longitudinal direction, the plurality of ribs are arranged in parallel along the transverse direction of the glass layer body, each of said ribs extends along the longitudinal direction of the glass layer body from a top end of the glass layer body to a bottom end of the glass layer body, a groove being formed between every two adjacent said ribs, wherein both ends of the groove are drain outlets; a movable brush arranged on an outer surface of each of said ribs; and a drive mechanism connecting with the movable brush for driving the movable brush to be reciprocated on the outer surface of said ribs.

13. The display screen according to claim 12, wherein the display panel is attached to a lower surface of the glass layer.

14. The display screen according to claim 13, wherein peripheries of the display panel and the glass layer are sealed.

15. The display screen according to claim 12, wherein the movable brush has a surface attached to the outer surface of the rib.

16. The display screen according to claim 12, further comprising a haze detecting device respectively electrically connecting the display panel and the drive mechanism, the haze detecting device detecting a number of blurry pixels of the display panel and determining whether to control the drive mechanism to drive the movable brush sliding according to the number of blurry pixels.

* * * * *